(12) United States Patent
Den Boer et al.

(10) Patent No.: US 9,709,259 B2
(45) Date of Patent: Jul. 18, 2017

(54) LIGHTING DEVICE COMPRISING AN IMPROVED HEAT TRANSFERRING ARRANGEMENT

(71) Applicant: PHILIPS LIGHTING HOLDING B.V., Eindhoven (NL)

(72) Inventors: Reinier Imre Anton Den Boer, Eindhoven (NL); Peter Johannes Martinus Bukkems, Deurne (NL); Johannes Petrus Maria Ansems, Hulsel (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 0 days.

(21) Appl. No.: 14/646,534

(22) PCT Filed: Sep. 18, 2013

(86) PCT No.: PCT/IB2013/058624
§ 371 (c)(1),
(2) Date: May 21, 2015

(87) PCT Pub. No.: WO2014/080301
PCT Pub. Date: May 30, 2014

(65) Prior Publication Data
US 2015/0292726 A1    Oct. 15, 2015

Related U.S. Application Data

(60) Provisional application No. 61/729,661, filed on Nov. 26, 2012.

(51) Int. Cl.
*F21V 29/00* (2015.01)
*F21V 29/70* (2015.01)
(Continued)

(52) U.S. Cl.
CPC ............. *F21V 29/70* (2015.01); *F21K 9/23* (2016.08); *F21K 9/90* (2013.01); *F21V 29/20* (2013.01);
(Continued)

(58) Field of Classification Search
CPC ...... F21V 29/507; F21V 29/503; F21V 29/70; F21V 29/20; F21V 3/02; F21V 29/506;
(Continued)

(56) References Cited

U.S. PATENT DOCUMENTS 7,121,687 B2    10/2006  Sidwell et al.
8,253,344 B2 *  8/2012   Guest ................ F21K 9/135
                                                     315/193

(Continued)

FOREIGN PATENT DOCUMENTS

CN      201973475 U      9/2011
DE      202009017104 U1  3/2010
(Continued)

*Primary Examiner* — Donald Raleigh
*Assistant Examiner* — Kevin Quarterman

(57) ABSTRACT

The present invention relates to a lighting device (100) (100), comprising at least one light emitting element (102) configured to emit light, a housing (300) having an elongated hollow base portion (302) and a light exit portion (304), wherein the elongated hollow base portion (302) has a polygonal cross section, and a heat transferring arrangement (200) formed from a folded sheet of a thermo conducting material inserted into and fixed inside of the housing (300), the heat transferring arrangement (200) comprising a first section (202) onto which the light emitting element (102) is arranged and adapted to receive heat generated from the at least one light emitting element (102) when emitting light, and a second section (204) having an outer surface which once fixed inside of the housing (300) is formed to be in abutment with an inner surface of the elongated hollow base portion (302) of the housing (300), so that the generated (Continued)

heat is thermally transferred to the housing (300). The present invention also relates to a corresponding method for forming a lighting device (100).

16 Claims, 4 Drawing Sheets

(51) Int. Cl.
| | |
|---|---|
| *F21K 9/90* | (2016.01) |
| *F21V 29/507* | (2015.01) |
| *F21V 29/503* | (2015.01) |
| *F21K 9/23* | (2016.01) |
| *F21V 14/02* | (2006.01) |
| *F21V 19/00* | (2006.01) |
| *F21V 23/00* | (2015.01) |
| *F21V 29/506* | (2015.01) |
| *F21V 3/02* | (2006.01) |
| *H05K 1/18* | (2006.01) |
| *F21Y 101/00* | (2016.01) |
| *F21Y 115/10* | (2016.01) |
| *F21Y 107/40* | (2016.01) |

(52) U.S. Cl.
CPC .......... *F21V 29/503* (2015.01); *F21V 29/507* (2015.01); *F21V 3/02* (2013.01); *F21V 14/02* (2013.01); *F21V 19/004* (2013.01); *F21V 23/005* (2013.01); *F21V 29/004* (2013.01); *F21V 29/506* (2015.01); *F21Y 2101/00* (2013.01); *F21Y 2107/40* (2016.08); *F21Y 2115/10* (2016.08); *H05K 1/189* (2013.01); *H05K 2201/056* (2013.01); *H05K 2201/10106* (2013.01)

(58) Field of Classification Search
CPC .... F21V 29/004; F21V 19/004; F21V 23/005; F21V 14/02; H05K 2201/10106; H05K 1/189; H05K 2201/056; F21K 9/90; F21K 9/1355; F21Y 2101/02; F21Y 2111/007
See application file for complete search history.

(56) References Cited

U.S. PATENT DOCUMENTS

| | | | |
|---|---|---|---|
| 8,894,268 B2 * | 11/2014 | Igaki | .................... F21V 29/004 362/249.02 |
| 2005/0024875 A1 | 2/2005 | Zhang | |
| 2009/0175041 A1 | 7/2009 | Yuen et al. | |
| 2010/0103667 A1 | 4/2010 | Thrailkill | |
| 2012/0075854 A1 | 3/2012 | Maxik et al. | |

FOREIGN PATENT DOCUMENTS

| | | |
|---|---|---|
| DE | 202011104223 U1 | 12/2011 |
| WO | 2010032181 A1 | 3/2010 |
| WO | 2012134305 A1 | 10/2012 |

\* cited by examiner

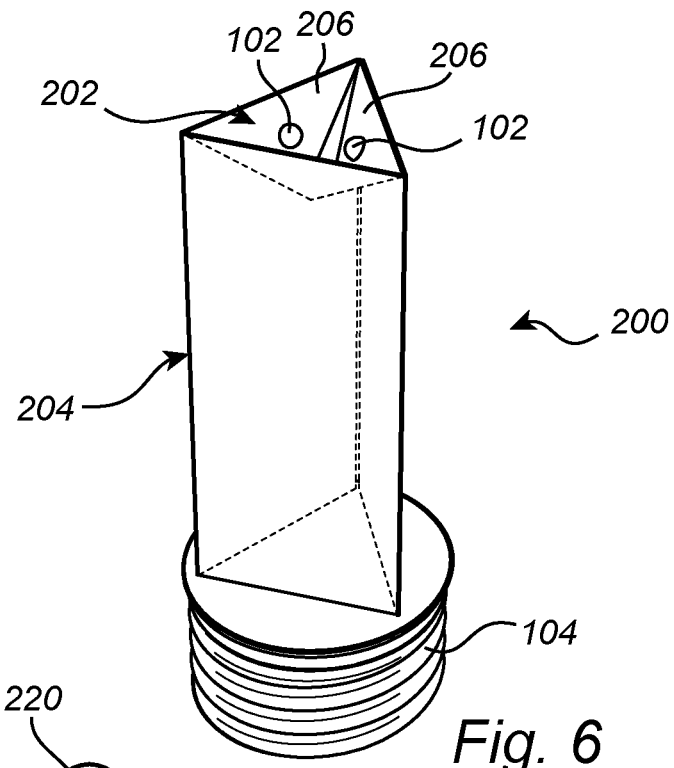
Fig. 6
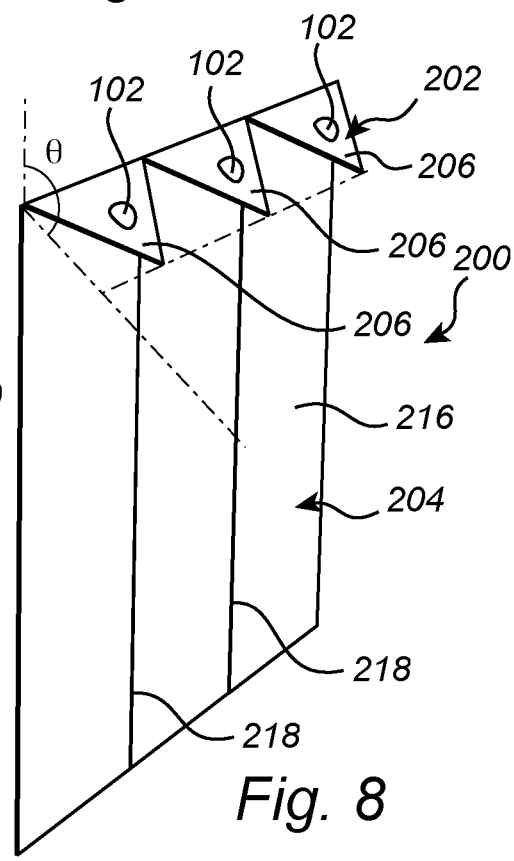
Fig. 7
Fig. 8

LIGHTING DEVICE COMPRISING AN IMPROVED HEAT TRANSFERRING ARRANGEMENT

CROSS-REFERENCE TO PRIOR APPLICATIONS

This application is the U.S. National Phase application under 35 U.S.C. §371 of International Application No. PCT/IB13/058624, filed on Sep. 18, 2013, which claims the benefit of U.S. Provisional Patent Application No. 61/729,661, filed on Nov. 26, 2012. These applications are hereby incorporated by reference herein.

FIELD OF THE INVENTION

The present invention generally relates to a lighting device comprising an improved heat transferring arrangement for transferring heat generated by the lighting device. The present invention also relates to a method for forming a corresponding lighting device.

BACKGROUND OF THE INVENTION

Today, the interest in developing and improving alternative lighting devices has greatly increased due to the removal of incandescent light bulbs on the market. This has further lead to increased demands on reduced production costs and to increase the performance of the alternative lighting devices. For example, lighting devices with light emitting diodes have several advantages compared to other conventional lighting, including for example high energy efficiency, high light output and long service life.

However, the use of light emitting diodes is generally associated with problem regarding the efficiency of heat transportation to avoid temperatures to rise to a level that may hamper the light output emission. In some cases, increased temperature levels may even damage some of the light emitting diodes to prevent that light may be emitted. Accordingly, this may result in a reduced light output as well as to affect the light distribution negatively.

Conventionally, to mitigate these problems thermal interface materials (TIMs) are often used to increase heat conductivity between surfaces as well as protect the surfaces from damage. However, this typically results in a more complicated productions process thereby increasing the cost of producing the lighting device. The thermal interface materials are further inconvenient due to the smeary nature of the material and the additional consumption of material. Therefore, it would be advantageous to provide a lighting device with an efficient heat transfer and an improved heat transfer arrangement to fulfill the requirements of light output intensity and distribution.

Hence, there is a further need for a lighting device with an improved heat management able to allow a desired light output and distribution from the lighting device.

SUMMARY OF THE INVENTION

It is an object of the present invention to provide an improved lighting device in order to at least partly overcome above mentioned problems.

According to an aspect of the present invention there is provided a lighting device that comprises at least one light emitting element configured to emit light, a housing having an elongated hollow base portion and a light exit section, wherein the elongated hollow base portion has a polygonal cross section, and a heat transferring arrangement formed from a folded sheet of a thermoconducting material inserted into and fixed inside of the housing, the heat transferring arrangement comprising a first section onto which the at least one light emitting element is arranged and adapted to receive heat generated from the at least one light emitting element when emitting light, and a second section having an outer surface which once fixed inside of the housing is formed to be in abutment with an inner surface of the elongated hollow base portion of the housing, so that the generated heat is thermally transferred to the housing.

The present invention is based on the insight that at least one lighting device may be arranged onto a folded heat transferring arrangement configured to transfer heat from the light at least one emitting element, further utilizing the abutment between the heat transferring arrangement and the housing to transfer heat to the housing. The housing may thus be able to be utilized as an additional heat transferring element, such as a heat sink, to transfer heat to the surrounding. This additional surface improves the heat transfer to the surrounding and thus the heat transferring efficiency of the lighting device. The elongated hollow base portion of the housing has a polygonal cross section where each surface of the base portion preferably is essentially flat. Furthermore, the surfaces of the second section of the heat transferring arrangement are also preferably essentially flat, configured to correspond to the flat inner surfaces of the elongated hollow base portion, to create a thermal interface where the surfaces of the second section of the heat transferring arrangement and the elongated hollow base section of the housing are in close abutment. The polygonal cross section may, for example, be a triangle, a square etc. Thus, the base portion has at least three surfaces, and regardless of how many surfaces the base portion has, each surface has preferably an essentially flat surface.

Accordingly, this defines the elongated hollow base portion to have at least three corners, where the corner in an embodiment may be rounded out. Furthermore, the wording "elongated hollow base portion" should in the following be interpreted as a tubular base portion with a through hole extending through the entire base portion of the housing, creating a cavity that may extend throughout the complete housing. In addition, it should be understood that the polygonal cross section may be defined in a direction perpendicular to an extension of the direction of the elongated hollow base portion.

According to the invention, when inserted into the housing, the heat transferring arrangement may be folded to avoid or at least reduce friction between the housing and the heat transferring arrangement. Otherwise, the non-reduced friction may cause chinks, scratches or even fractures in the housing, which may cause problems with the functionality of the lighting device. Additionally, by providing a heat transferring arrangement formed from a folded sheet of a thermoconducting material it may be possible to optimize a thermal interface between the heat transferring arrangement and the housing, such that the thermal interface includes the entire inner surface of the housing of elongated hollow base portion in the lighting device. Both the folded second section of the heat transferring arrangement and the inner surfaces of the elongated hollow base portion are flat, such that when placed in abutment with each other the surface contact is optimized. By optimizing the surface contact, the heat transfer may also be increased.

Furthermore, the elongated hollow base portion may include a draft angle, such that the diameter of the elongated hollow base portion slightly decreases closer towards the light exit portion of the housing. The draft angle may be adjusted to facilitate insertion of the heat transferring arrangement into the elongated hollow base portion as well as in regards to manufacturing of the housing (e.g. by means of injection molding).

"The interface surface" should in the following be interpreted as the interface between the inner surface of the elongated hollow base portion of the housing and the outer surface of the second section of the heat transferring arrangement in the abutment with each other. Thus, by increasing the surface of the thermal interface surface the more heat may be transferred to the housing. Moreover, as the light emitting element(s) in many applications is arranged at a centre of the housing, i.e. far away from the inner surface of the housing, the present invention is also based on the insight that by providing a foldable thermoconductive sheet, connected to the light emitting elements and extending in a direction towards the inner surface of the elongated hollow base portion, heat generated by the light emitting element(s) may be thermally transferred to the housing when being mounted to the first section of the heat transferring arrangement as the second section of the heat transferring arrangement, when mounted to the housing, is in abutment with the essentially flat inner surface of the heat transferring arrangement.

An advantage of the invention is thus that a passive heat transferring arrangement is provided which may reduce the need of an external fan or membranes to provide sufficient cooling. The heat transferring arrangement, especially the second section of the heat transferring arrangement, should in the following and throughout the entire description be interpreted as a folded sheet which when placed in abutment with the inner surface of the elongated hollow base portion of the housing can bend and adjust to the specific geometry of the housing.

A further advantage with the invention is that the heat transferring arrangement is formed by a thermoconducting sheet, wherein the second section of the heat transferring arrangement is adapted to follow the inner surface of the housing in the elongated hollow base portion which creates a passage or a recess in the elongated hollow base portion. Both the inner surface of the base portion of the housing and the second section of the heat transferring arrangement are comprised of flat surfaces, to improve the surface contact when abutted. By using a foldable sheet extending along the surfaces of the elongated hollow base portion, the heat transferring arrangement takes up limited space. Due to the limited space taken up by the heat transferring arrangement in its elongated hollow shape, it offers the possibility of incorporating additional components. The components may, for example, be configured to control the light output of light emitting element, etc.

The expression "transfer heat" should in the following be understood as heat which is generated in the first section of the heat transferring arrangement and thereafter further transferred through the second section of the heat transferring arrangement to the housing. The thermoconducting sheet may for example be a flexible PCB, and the heat transferring arrangement is therefore able to receive the lighting emitting elements directly onto the first section of the heat transferring arrangement.

According to an exemplary embodiment, an inner surface of the second section of the heat transferring arrangement may be configured to receive electrical driver circuitry for controlling the at least one light emitting element. The inner surface of the second section of the heat transferring arrangement described above should be interpreted as the opposite side of the second section surface of the heat transferring arrangement facing the inside of housing. Moreover, the heat transferring arrangement may preferably be made of a metal substrate PCB which may be folded and arranged to follow the inner surface of the elongated hollow base portion of the housing. The use of a metal substrate PCB for a heat transferring arrangement enables the light emitting element(s) to be configured directly on the first section of the heat transferring arrangement.

According to another embodiment, the heat transferring arrangement may be formed from a single sheet of the thermoconducting material. The use of a single sheet of thermoconducting material for a heat transferring arrangement limits the number of interfaces to one interface, which improves the heat transfer in the lighting device. Air gaps are more or less always created between two surfaces. Hence, several interfaces of layers of material may hinder the heat transfer through the lighting device, since air does not transfer heat as well as most material; especially not as the thermoconducting material is specifically chosen to transfer heat from the light emitting elements efficiently. Furthermore, the heat transferring arrangement may be able to integrate electronic functionality, optical and beam shaping functionality, and heat transferring functionality in a single sheet element. Further, a folded sheet may include a spring like characteristic, especially in the corners of the folding, aiming to unfold the sheet. The thermal interface between the elongated hollow base portion of the housing and the second section of the heat transferring arrangement can further be improved by the outwards applied pressure resulting from the spring like characteristic.

According to still another embodiment, the lighting device further comprises a core component centrally arranged in relation to the heat transferring arrangement and configured to provide an outward pressure to an inner surface of the second section of the heat transferring arrangement once the heat transferring arrangement is fixed inside of the housing. The wording "core component" may be any type of object or material, arranged in the elongated hollow base portion on an inner side of the heat transferring arrangement configure to further apply an outward pressure to reduce air gaps between the housing and the heat transferring arrangement. The inner surface of the heat transferring arrangement is the opposite side of the outer surface of the heat transferring arrangement in abutment with the inner side of the elongated hollow base portion of the housing. An advantage with this is that the additional pressure may further improve the heat transfer by improving the thermal interface. The heat transfer between two layers of material may be affected how much surface contact layers have with each other. Thus, more surface contact equals a better thermal interface. In addition, reducing the distance between the second section and the elongated hollow base portion also improves the heat transfer. The core component may, for example, be a construction of springs, rubber component, an expanding core or another type of elastic core to further pressure the second section to the inner surface of the elongated hollow base portion. Furthermore, the inner side of the heat transferring arrangement may be molded with a plastic injection.

Preferably, the first section of the heat transferring arrangement, when fixed inside of the housing, may protrude within the light exit section of the housing. Light emitting elements may be placed directly on the first section of the heat transferring arrangement. In order to spread the light emitted from the light emitting elements, the first section of the heat transferring arrangement is protruding within the light exit section, such that light may be emitted into the surroundings. Preferably, the light emitting element(s) is a solid state light source such as a light emitting diode (LED) or a laser diode.

The protruding first section of the heat transferring arrangement mounted with at least one lighting emitting element may further include an optical component configured to shape the emitted light from the lighting emitting element, such as a collimator, multi-collimator, reflector, lens, etc. Hereby, the light emitted by the light emitting element may be arranged in a specific desired form. The first section of the heat transferring arrangement may, for example, be at least one extending tab. The tab may be of any shape, such as for example tapered, squared, rectangular, elliptical or oval. In the case of a lighting device with a plurality of tabs, one tab may be configured in different angle compared to a second tab to be able to provide additional light output distributions.

Preferably, the first section of the heat transferring arrangement may be arranged at a predetermined inward angle in relation to the second section of the heat transferring arrangement. An advantage with this embodiment is that the intensity distribution may be determined by the angle of the first heat transferring arrangement. By altering the angle of the first heat transferring arrangement it is possible to tune the luminous intensity distribution and direct the light in a desired direction. For example, most light emitting diodes emit light in a forward direction, which implies that the angular distribution is limited which is an advantageous feature for spot-light sources intended to highlight a specific object. However, in some applications for all-round light sources an even light intensity distribution is desired, which can be compared to an incandescent light source. To achieve an even output distribution; the inward angle can be altered. The inward angle may range from 0° to 180°, the inward angle is adjusted based on the lighting device and its application. For example, the inward angle may range between 45° to 135°, preferably around 90°, for a spot-light to arrange that the main part of the light is directed straight forward. However, for other types of lighting devices arranged for general lighting, such as for example a ceiling lamp, a wall lamp, a decorative lamp, other angles may be more suitable. The tabs in the first section of the heat transferring arrangement may be arranged with different angles within the lighting device to further be able to comply with different desired light output distribution.

Additionally, the first section of the heat transferring arrangement may comprise an extension portion, configured for mounting at least one additional light emitting element, which is arranged in a second inward angle in relation to the second section of the heat transferring arrangement. An advantage with such an arrangement is that additional light emitting elements may be added to the first section of the heat transferring arrangement, which may lead to a higher intensity lighting device. Furthermore, by adding an extension portion in a second inward angle an evenly distribution of the emitted light may be achieved more easily.

Still further, the inward angle of the first section of the heat transferring arrangement may be controllable in relation to the second section of the heat transferring arrangement. By controlling the angle of the first section of the heat transferring arrangement, the lighting device may be utilized either as a spot-light for highlighting a specific object or as a light source providing general diffuse lighting to the surroundings depending on the setting of the inward angle. An advantage of the embodiment is that the light output distribution may be customized based on the situation and event.

Additionally, the inward angle of the first section of the heat transferring arrangement is between 20° to 80°, configured to output an even light intensity distribution through the light exit section of the lighting device. A lighting device configured to distribute light with an even distribution configured to be used as a main illumination source in for example a room, the inward angle range is preferably between 15° to 45°. An even light intensity distribution should be interpreted as when the plurality of light output angles of a dome-like shape falls within a predetermined light intensity range.

The light exit portion of the housing is preferably transparent. The word transparent in the context of this invention should be interpreted broadly, meaning transparent for light radiation in general, for instance, the light exit portion may be clear, colored, diffuse, frosted, scattered or opaque.

Furthermore, the housing may be made of glass, plastic, ceramic or any combinations thereof. The flexible heat transferring arrangement is especially adjusted to be inserted and fixed inside a housing made of glass, plastic, ceramic or any combinations thereof. Due to the flexible and foldable nature of the heat transferring arrangement, the heat transferring arrangement may be inserted without causing damage to the inner surface of the elongated hollow base portion.

According to still another embodiment, the lighting device may further comprise a layer of thermal interface material arranged to be sandwiched between the outer surface of the second section of the heat transferring arrangement and the inner surface of the elongated hollow base portion of the housing. By adding a layer of thermal interface material it may further be possible to improve the heat transfer between the heat transferring arrangement and the housing. The thermal interface material may be able to fill out irregularities and air pockets in the surfaces such that the contact between the surfaces is increased.

According to another aspect of the invention, there is provided a method for forming a lighting device, comprising the steps of providing at least one light emitting element configured to emit light, providing a housing having an elongated hollow base portion and a light exit portion, wherein the elongated hollow base portion has a polygonal cross section, providing a heat transferring arrangement of a foldable thermoconducting sheet, the heat transferring arrangement comprising a first section onto which the at least one light emitting element is arranged, and a second section provided for transferred heat generated by the at least one light emitting element to the housing, folding the heat transferring arrangement such that it corresponds to the polygonal cross section of the base portion of the housing, inserting the heat transferring arrangement into the housing, and arranging an outer surface of the heat transferring arrangement to be in abutment with an inner surface of the elongated hollow base portion of the housing. Features of the method for forming a lighting device provide similar advantages as discussed above in relation to the previous aspect of the invention.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The aspect of the invention, including its particular features and advantages, will be readily understood from the following detailed description and the accompanying drawings, in which:

FIG. 6 illustrates a perspective view of the heat transferring arrangement according to another example embodiment.

FIG. 7 shows a top view of the lighting device according to another example embodiment of the invention.

FIG. 8 illustrates a pre-folded heat transferring arrangement in a perspective view.

DETAILED DESCRIPTION

Figure 1:
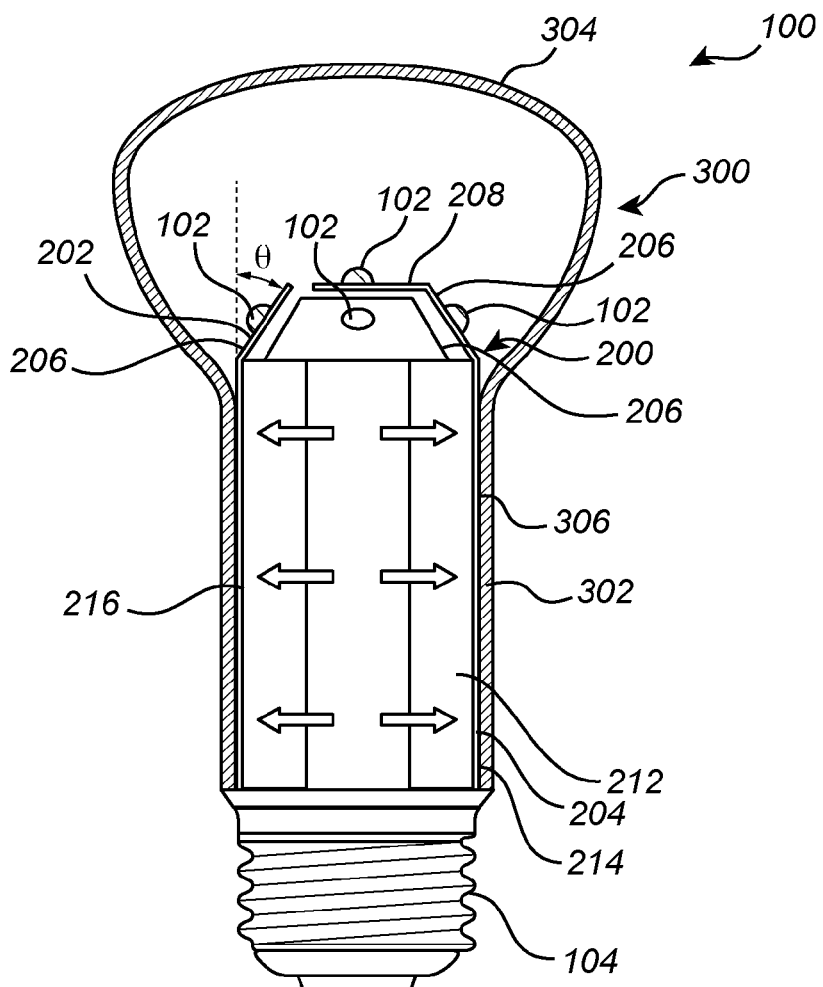
FIG. 1 illustrates a cross-sectional side view of lighting device according to an example embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person. Like reference characters refer to like elements throughout.

Figure 2:
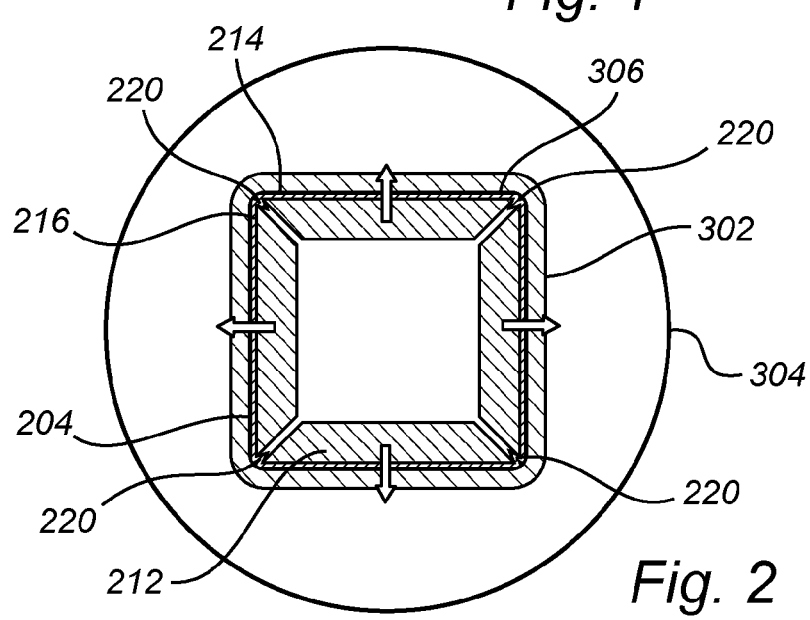
FIG. 2 shows a top-view of the lighting device according to an example embodiment.

Referring now to the drawings and to FIGS. 1 and 2 in conjunction, there is depicted a cross-section and a perspective view, respectively, of the lighting arrangement 100 comprising a heat transferring arrangement 200 inserted in a housing 300.

As is illustrated in FIG. 1, the housing 300 may be been seen as divided into an elongated hollow base portion 302 and a light exit portion 304. The elongated hollow base portion 302 is illustrated as having flat side-surfaces, while the light exit portion 304 is illustrated as having a bulb-like shape. Furthermore, the heat transferring arrangement 200 comprises a foldable sheet of thermoconducting material with a first section 202 and a second section 204, which in the illustrated embodiment is a flexible PCB. The heat transferring arrangement 200 may e.g. be provided from the same sheet of material. The first section 202 is configured for receiving and mounting of a light emitting element 102, such as a solid state light source, in the illustrated embodiment LEDs 102 are arranged thereto. The first section 202 comprises at least one tab 206; the illustrated embodiment in FIG. 1 has four, configured to protrude in the light exit portion 204 of the housing 300 such that light from the light emitting elements 102 is emitted to the surroundings. The tabs 206 may have any number of forms, such as rectangular, tapered, oval, elliptical, triangular, etcetera. In the illustrated embodiment, the light emitting elements 102 are mounted directly on the first section 202 of the heat transferring arrangement 200, more specifically on the tabs 206. The second section 204 is further configured to correspond to the shape of the inner surface 306 of the elongated hollow base portion 302.

As is illustrated in FIG. 1, the first section 202 and the second section 204 of the heat transferring arrangement 200 are made out of a single sheet of thermoconducting material to improve the heat transfer through the heat transferring arrangement 200. The first section 202 is configured to transfer heat, generated by the light emitting elements 102 when emitting light, to the second section 204 of the heat transferring arrangement 200. The second section 204 may form a thermal interface 214 with the inner surface 306 of the elongated hollow base portion 302, by being in abutment with the inner surface 306 of the elongated hollow base portion 302. The thermal interface 214 is arranged to increase the thermal conductivity between the heat transferring arrangement 200 and the housing 300. Hereby, the heat may then be transferred to the housing 300 and on to the surrounding. The thermal interface 214 between the housing 300 and the heat transferring arrangement 200 comprises of flat surfaces in abutment. To optimize the thermal interface 214, the surfaces area in physical contact should be preferably (but not limited to) maximized.

As discussed above, the elongated hollow base portion 302 is configured to have a polygonal cross section, and in the illustrated embodiment of FIG. 1 the base portion 302 has a quadrilateral cross-section with equal sides configured as a square with 90° angles. However, any other polygon shaped cross section having at least three sides may also be conceivable.

Reference is now also made to FIG. 2, in which for illustrative purpose, the first section 202 of the heat transferring arrangement 200 is not illustrated. In FIG. 2, the inner surface 306 of the elongated hollow base portion 302 is extending in a straight line between each corner. The second section 204 of the heat transferring arrangement 200 may be folded, such that the second section 204 is adjusted to fit along the inner surface 306 of the elongated hollow base portion. Thus, the distance between two folded lines 220 of the second section 204 corresponds to the distance between two corners 220 of the elongated hollow base portion 302. The second section 204 comprises a flat thermoconducting sheet folded to match the distance between the corners of the elongated hollow base portion 302. The corresponding shape enables the second section to become fixed along the inner surface 306 of the base portion 302, when the heat transferring arrangement 200 has been inserted in the housing.

The heat transferring arrangement 200 comprises a flexible PCB or metal substrate PCB. By using a PCB or a metal substrate PCB, electronics may easily be integrated with the heat transferring arrangement 200 for example driver components and LEDs. This possibility of integration may further reduce the cost as well as provide for optimal function integration. The second section 202 may be seen as having (when fixed in the elongated hollow base portion 302) an elongated hollow shape essentially corresponding to the elongated hollow base portion 302. The configuration of the heat transferring arrangement 200 further offers the possibility of additional components, due to the provided space in the centre of the base portion 302.

Again with reference to FIG. 1, the light emitting elements 102 are, as described above, mounted on the first section 202 of the heat transferring arrangement 200. The LEDs are mounted on the tabs 206 such that the light may be directed through the light exit portion 304 of the housing 300. The heat generated by the light emitting elements 102 when emitting light is transferred to the first section 202 of the heat transferring arrangement 200, i.e. released in the opposite direction compared to the light beams of the light emitting elements 102. The tabs 206 are configured in an inward angle in relation to the second section 204, in the illustrated embodiment the inward angle is approximately 45°. The angle of the tabs affects both the light distribution and the optical efficiency. The tabs may have different length depending on the inward angle of the first section 202. The tabs 206 may have a length such that they extend into the cavity of the light exit portion 304, near the surface of the light exit portion 304. Furthermore, the length of the tabs 206 may be adjusted to avoid that the light reflected from the light exit portion 304 is transmitted into the elongated hollow base portion 302. Therefore, both the shape and the length of the tabs 206 may be adjusted to decrease the separation between the tabs 206 to hinder that light is lost in the base portion 302.

A tab may also comprise an extension portion 208 with a second inward angle in relation to the second section 204. The extension portion 208 protrudes from the end portion of a tab 206. The illustrated extension portion 208 is arranged in a 90° inward angle compared to the second section 204 of the heat transferring arrangement 200. The extension portion 208 is further configured for mounting additional light emitting elements 102, such as LEDs. It is particularly advantageous to be able to configure the inward angle, θ, of the tabs, such that a desired light distribution may be achieved, since the range of the light output angles for light emitting diodes often are restricted. The tabs 206 may be controlled by an integrated control unit configured to alter the inward light output angle for the light emitting elements 102, such that the light distribution may be set depending on the situation. By being able to alter the angle, the same lighting device 100 may be use as a spot-light and as a general light source emitting light with a broader of light output angles in separate situations. The light emitting elements may have integrated optical and beam shaping elements such as a reflector, lens, collimator, etc. It is further conceivable to reduce the visibility of the light emitting elements, by arranging the inward angle of the first section 202 to exceed 90°, which means that the light emitting element 102 are folded down into the second section 204. To achieve an even light distribution with a plurality of light output angles encompassing the light exit portion 304 of the housing 300, light emitting elements may be placed in a 15°-45° angle in relation to the second section 204 around the first section 202 of the heat transferring arrangement.

The second section 204 may be configured to provide an outward directed pressure, illustrated with arrows, to improve the thermal interface 214 between the elongated hollow base portion 302 and the second section 204. The outward directed pressure may be a result from the folded heat transferring arrangement 200 having the drive to unfold. The feature of unfolding, may lead to that the second section 204 is further pressing against the base section 302 such that the thermal interface 214 is improved. The outward directed pressure may alternatively (or additionally) result from a core component 212 inserted in the housing 300, such that the second section 204 of the heat transferring arrangement 200 is encompassed between the elongated hollow base portion 302 and the core component 212.

The heat transferring arrangement 200 may, preferably, be made of flexible PCB or a metal substrate PCB. The heat transferring arrangement 200 may, further, be made of a metal material which has a satisfactory heat conductive characteristics and which is not too rigid, in order to be able to fold the heat transferring arrangement 200. Such material may, for example, aluminum. Other alternatives are of course conceivable, such as e.g. copper, heat pipes, flat heat pipes, etc. The lighting device 100 may particularly be advantageous for retrofit light bulbs, e.g. with an Edison screw base 104. Other interface means are of course possible and within the scope of the invention, e.g. including bayonet style, bi-post, bi-pin connector, or any other type of lamp base style of interface means. Again with reference to FIG. 2, the light exit portion 304 of the housing 300 viewed from above is substantially circular and transparent. The elongated hollow base portion 302 comprises in FIG. 2, a quadrilateral cross section with four equilateral sides arranged perpendicular to each other. Furthermore, the second section 204 of the heat transferring arrangement have contact around the entire the inner surface 306 of the base portion 302, which means that the second section 204 has the corresponding cross section as the elongated hollow base portion 302. The inner surface 216 of the second section 204 has further been molded with plastic, as the core component 212. Other core component 212 such as, plastic injections, thermofolded or metal shapes may also be conceivable. Furthermore, by molding a more rigid layer such that the second section of the heat transferring arrangement is encompassed on both sides, the molding layer creates a resistance reducing the possibility of that the second section 204 of the heat transferring 200 is bended away from the inner surface 306 of the elongated hollow base portion 302. The core component 212 may further be provided with a spring characteristics providing an outward directed pressure may also be placed inside or molded over the inner surface 216 of the second section 204.

Figure 3:
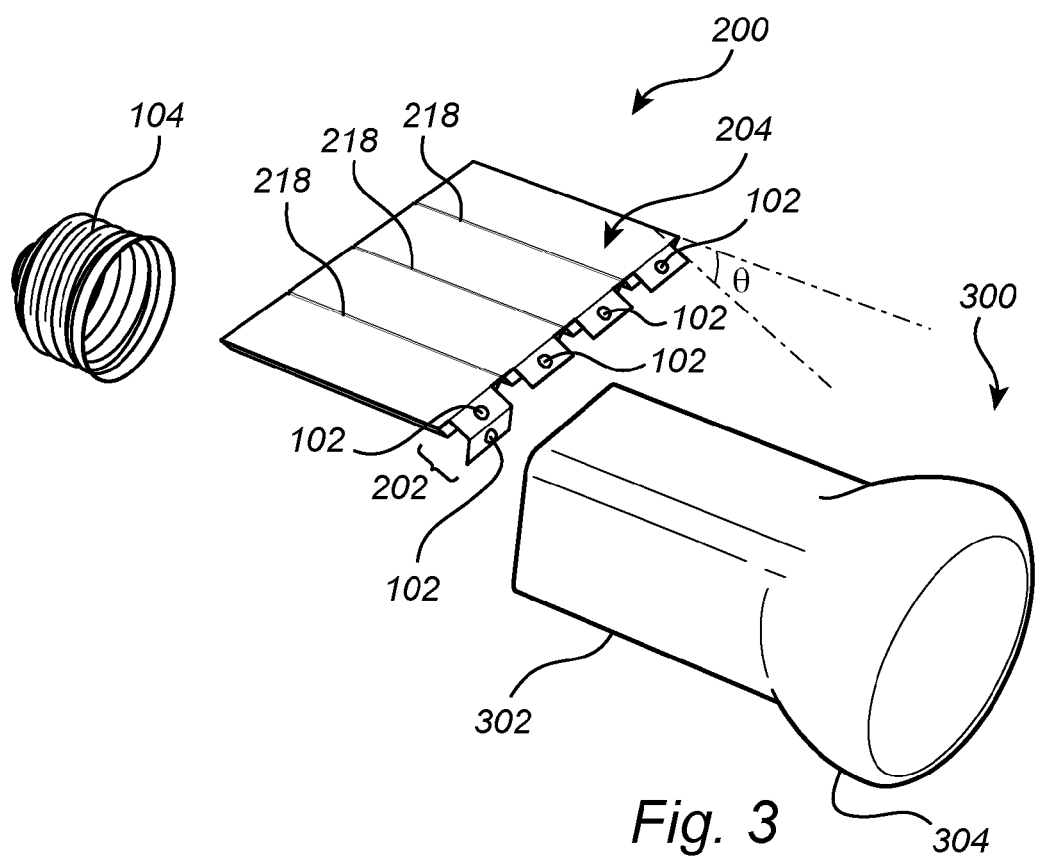
FIG. 3 illustrates an exploded perspective view of an example embodiment of the lighting device in FIG. 1.

Reference is now made to FIG. 3, illustrating an exploded perspective view of the lighting device in FIG. 1. The lighting device from FIG. 1 is, in the illustrated embodiment, exploded in three parts, a cap 104, a heat transferring arrangement 200 with integrated light emitting elements 102 and a housing 300. The second section 204 of the heat transferring arrangement 200 is illustrated as an unfolded flat sheet with pre-folded lines 218 such that the distance between the pre-folded lines 218 corresponds to the widths of the sides of elongated hollow base portion 302 of the housing 300. Hereby, the second section 204 may be folded along the pre-folded lines 218 when inserted in the housing 300 to reduce the friction. While the folded lines 220 may, on one hand, reduce the pressure when inserting the heat transferring arrangement by folding it and on the other hand provide and a relatively secure thermal interface 214 between the second section 204 of the heat transferring arrangement and the inner surface 306 of the elongated hollow base portion 302 by the outward directed pressured through the unfolding feature of the heat transferring arrangement 200.

In the illustrated embodiment, the first section 202 of the heat transferring arrangement comprises four tabs which are bent in an inward angle, θ. Accordingly, one of the tabs has an extension portion in a second inward angle compared to the second section of the heat transferring arrangement.

Figure 4:
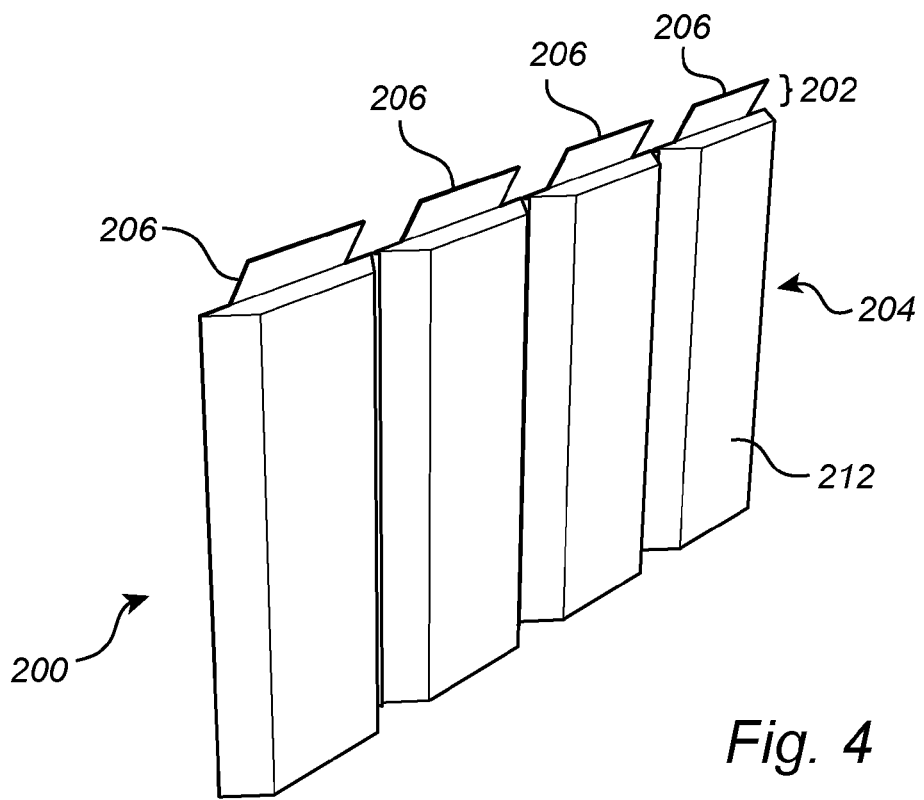
FIG. 4 illustrates a perspective view of a pre-folded heat transferring arrangement in step before inserting the heat transferring arrangement in housing.

Reference is now made to FIG. 4, illustrating the opposite side of the heat transferring arrangement in FIG. 3. The heat transferring arrangement embodied in FIG. 4 has the same functionalities as the heat transferring arrangement 200 described in relation to FIGS. 1-3, and those features and functionalities will not be described further if not indicated such. Now, as is illustrated in FIG. 4, the heat transferring arrangement 200 displays the inner side covered with a molded plastic injection. In close proximity of the prefolded lines 218 the thickness of the molded plastic injection is reduced to further be able to bend and fold the heat transferring arrangement 200.

Figure 5:
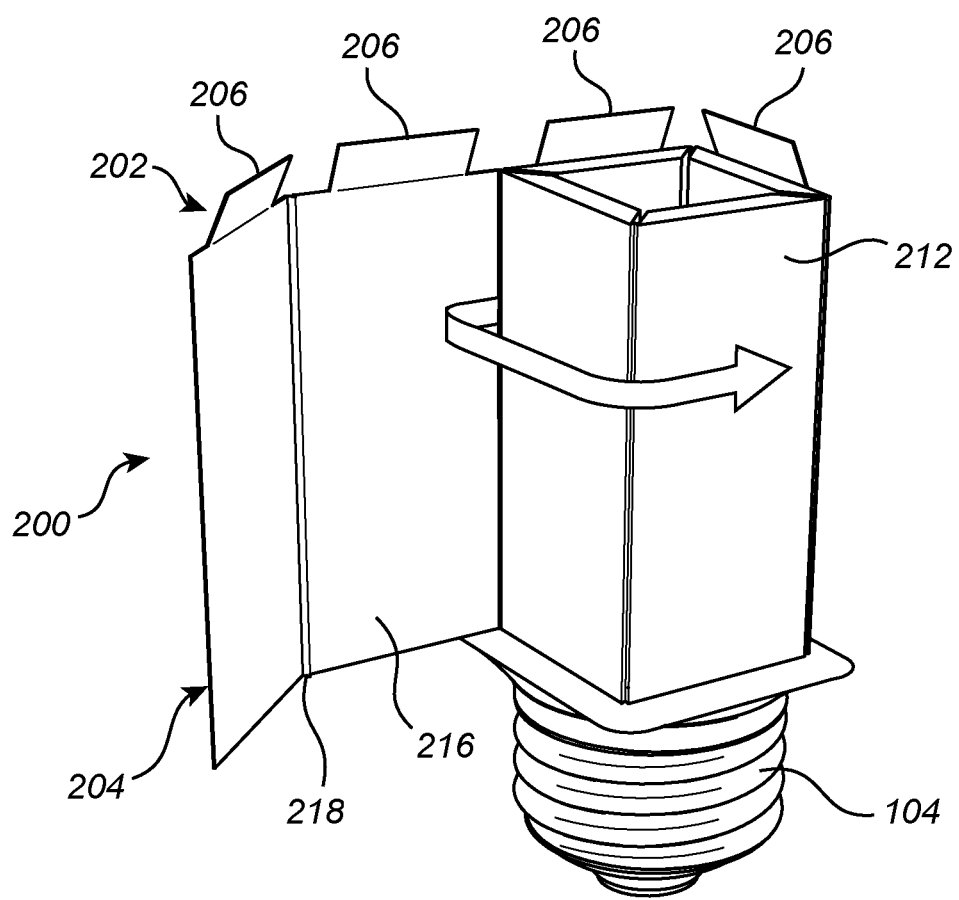
FIG. 5 illustrates, from a perspective view, a heat transferring arrangement arranged to be wrapped around a core component.

Reference is now made to FIG. 5, illustrating that a heat transferring arrangement 200 may be folded around a core component 212, preferably elastic core component 212. In FIG. 5 the heat transferring arrangement according to previous FIGS. 1-4 is illustrated with a elastic core component. Further, the core component 212 is attached to the cap 104 of the retrofit lighting device 100. However, in FIG. 5 the housing 300 is not illustrated. As is illustrated in FIG. 5, the sides of the core component 212 fit in between the prefolded lines 218 of the heat transferring arrangement 200.

Reference is now made to FIG. 6, illustrating another example of the heat transferring arrangement 100. As is illustrated, the second section of the heat transferring arrangement 200 has the form of a triangle polygonal when arranged attached to a cap of the lighting device 100. The heat transferring arrangement 200 comprises the shape of a hollow prism and the first section 202 of the heat transferring arrangement is extending on the opposite end from the cap 104. The first section 202, in FIG. 6, comprises three tabs 206, where one tab 206 is extending from each side of the second section 204. As is illustrated, the tabs 206 are folded down into the second section 204, shaped as a prism with an inward angle that exceeds 90°. The tabs 206 are shaped as triangles, such that one side is attached to the second section 204 and the tip is extending from the base of the triangle. As is illustrated, a light emitting diode is mounted on each tab 206. The heat transferring arrangement 200 illustrated in FIG. 6 is configured to be inserted in an elongated hollow base portion 302 with a corresponding triangular cross-section, which is not shown. Due to the triangular cross-section, the tabs in the first section 202 of the heat transferring arrangement 200 are shaped as a triangle and the length is extended, based on the inward angle, such that the tabs 206 are almost in connection with each other to reduce that light is transmitted in the hollow base portion 302.

Reference is now made to FIG. 7, illustrating a lighting device 100 from above, comprising the heat transferring arrangement 204 in FIG. 6 with an including a housing 300. The second section 204 of the heat transferring arrangement 200 has a triangular cross-section, which is also depicted in FIG. 6. The first section 202 is depicted as triangle tabs 206 extending from each side. Furthermore, the light exit portion 304 of the housing 300 is illustrated as having a triangular-like shape and the elongated hollow base section 302.

Turning to FIG. 8 illustrating a heat transferring arrangement 200 as described in FIGS. 6 and 7, with the main difference that the heat transferring arrangement 200 is unfolded as in a step before insertion in a corresponding housing 300. The heat transferring arrangement 200 is depicted in a perspective view of the inner surface 216 of the second section 204. The heat transferring arrangement 200 comprises a sheet of a metal substrate PCB. The first section 202 is comprised of down-folded tabs 206, where light emitting elements 102 are mounted.

Even though the invention has been described with reference to specific embodiments thereof, many different alterations, modifications and the like will become apparent for those skilled in the art. For example, the lighting device may still comprise a elongated hollow base portion with a polygon with more than four sides. Parts of the system may be omitted, interchanged or arranged in various ways, the system may yet being able to perform the method of the present invention.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage.

The invention claimed is:

1. A lighting device, comprising:
   at least one light emitting element configured to emit light;
   a housing having an elongated hollow base portion and a light exit portion, wherein the elongated hollow base portion has a polygonal cross section, and
   a heat transferring arrangement formed from a folded sheet of a thermoconducting material inserted into and fixed inside of the housing, the heat transferring arrangement comprising:
   a first section onto which the at least one light emitting element is arranged and adapted to receive heat generated from the at least one light emitting element when emitting light, and
   a second section having an outer surface which once fixed inside of the housing is formed to be in abutment with an inner surface of the elongated hollow base portion of the housing, so that the generated heat is thermally transferred to the housing.

2. Lighting device according to claim 1, wherein an inner surface of the second section of the heat transferring arrangement is configured to receive electrical driver circuitry for controlling the at least one light emitting element.

3. Lighting device according to claim 1, wherein the heat transferring arrangement is formed from a single sheet of the thermoconducting material.

4. Lighting device according to claim 1, wherein the lighting device further comprises a core component centrally arranged in relation to the heat transferring arrangement and configured to provide an outward pressure to an inner surface of the second portion of the heat transferring arrangement once the heat transferring arrangement is fixed inside of the housing.

5. Lighting device according to claim 1, wherein the first section of the heat transferring arrangement, when fixed inside of the housing, protrudes within the light exit section of the housing.

6. Lighting device according to claim 5, wherein the first section of the heat transferring arrangement is arranged at a predetermined inward angle in relation to the second section of the heat transferring arrangement.

7. Lighting device according to claim 6, wherein the first section of the heat transferring arrangement comprises an extension portion, configured for mounting at least one light emitting element, which is arranged in a second inward angle in relation to the second section of the heat transferring arrangement.

8. Lighting device according to claim 7, wherein the inward angle of the first section of the heat transferring arrangement is controllable in relation to the second section of the heat transferring arrangement.

9. Lighting device according to claim 6, wherein the inward angle of the first section of the heat transferring arrangement is between 20° to 80°, configured to output an even light intensity distribution through the light exit section of the lighting device.

10. Lighting device according to claim 1, wherein the housing is made of glass, plastic, ceramic or any combinations thereof.

11. Lighting device according to claim 1, wherein the lighting device further comprises a layer of thermal interface material arranged to be sandwiched between the outer surface of the second section of the heat transferring arrangement and the inner surface of the elongated hollow base portion of the housing.

12. Lighting device according to claim 1, wherein the second section of the heat transferring arrangement is folded to form an elongated hollow portion, and forms to have a polygonal cross section.

13. Lighting device according to claim 1, wherein the second section of the heat transferring arrangement is folded to form an elongated hollow portion, and wherein the entirely of the outer surface is formed to be in the abutment with the inner surface of the elongated hollow base portion of the housing.

14. Method for forming a lighting device, comprising the steps of:
   providing at least one light emitting element configured to emit light;
   providing a housing having an elongated hollow base portion and a light exit portion, wherein the elongated hollow base portion has a polygonal cross section;
   providing a heat transferring arrangement of a foldable thermoconducting sheet, the heat transferring arrangement comprising a first section onto which the at least one light emitting element is arranged, and a second section provided for transferred heat generated by the at least one light emitting element to the housing;
   folding the heat transferring arrangement such that it corresponds to the polygonal cross section of the base portion of the housing;
   inserting the heat transferring arrangement into the housing, and
   arranging an outer surface of the heat transferring arrangement to be in abutment with an inner surface of the elongated hollow base portion of the housing.

15. Method according to claim 14, further comprising the step of:
   arranging the first section of the heat transferring arrangement at a predetermined inward angle in relation to the second section of the heat transferring arrangement.

16. Method according to claim 14, further comprising the step of:
   providing a centrally arranged core component around which the heat transferring arrangement is folded, wherein the core component is configured to provide an outward pressure to an inner surface of the second portion of the heat transferring arrangement once the heat transferring arrangement is fixed inside of the housing.

* * * * *